United States Patent
Chung et al.

(10) Patent No.: US 11,158,693 B2
(45) Date of Patent: *Oct. 26, 2021

(54) DISPLAY APPARATUS AND METHOD OF MANUFACTURING THE SAME

(71) Applicant: Samsung Display Co., Ltd., Yongin-Si (KR)

(72) Inventors: Yung Bin Chung, Yongin-si (KR); Yeoungkeol Woo, Seongnam-si (KR); Kwanghyun Kim, Hwaseong-si (KR); Sangwoo Sohn, Yongin-si (KR); Dokeun Song, Yongin-si (KR); Sangwook Lee, Yongin-si (KR); Heon Sik Ha, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/575,845

(22) Filed: Sep. 19, 2019

(65) Prior Publication Data

US 2020/0111854 A1  Apr. 9, 2020

(30) Foreign Application Priority Data

Oct. 4, 2018  (KR) .................. 10-2018-0118152

(51) Int. Cl.
*H01L 27/32* (2006.01)
*H01L 27/12* (2006.01)

(52) U.S. Cl.
CPC ...... *H01L 27/3258* (2013.01); *H01L 27/1237* (2013.01); *H01L 27/3262* (2013.01)

(58) Field of Classification Search
CPC .............. H01L 27/3258; H01L 27/3262; H01L 27/1237
See application file for complete search history.

(56) References Cited

U.S. PATENT DOCUMENTS

| | | | |
|---|---|---|---|
| 10,332,916 B2 * | 6/2019 | Lee | ...................... H01L 21/7685 |
| 2006/0043373 A1 | 3/2006 | Wu et al. | |
| 2018/0012947 A1 * | 1/2018 | Lee | ...................... H01L 27/3272 |

FOREIGN PATENT DOCUMENTS

| | | |
|---|---|---|
| JP | 2018089950 A | 6/2018 |
| KR | 101339000 B1 | 12/2013 |
| KR | 101809885 B1 | 12/2017 |

OTHER PUBLICATIONS

Wu, et al., Effects of Trap-State Density Reduction by Plasma Hydrogenation in Low-Temperature Polysilicon TFT, IEEE Electron Device Letters, vol. 10, No. 3, pp. 123-125, Mar. 1989.

* cited by examiner

*Primary Examiner* — Matthew L Reames
(74) *Attorney, Agent, or Firm* — Cantor Colburn LLP

(57) ABSTRACT

A display apparatus includes a base substrate, an active pattern disposed on the base substrate, a gate insulation layer disposed on the active pattern, a gate electrode disposed on the gate insulation layer and overlapping the active pattern, a first insulation layer disposed on the gate electrode and having a total amount of hydrogen of about 5 atomic percent (at. %) to about 30 at. %, and a source electrode and a drain electrode which are disposed on the first insulation layer and are electrically connected to the active pattern.

13 Claims, 6 Drawing Sheets

DISPLAY APPARATUS AND METHOD OF MANUFACTURING THE SAME

This application claims priority to Korean Patent Application No. 10-2018-0118152, filed on Oct. 4, 2018, and all the benefits accruing therefrom under 35 U.S.C. § 119, the content of which in its entirety is herein incorporated by reference.

BACKGROUND

1. Field

Exemplary embodiments of the invention relate to a display apparatus and a method of manufacturing the display apparatus. More particularly, exemplary embodiments of the invention relate to a display apparatus capable of improving display quality and a method of manufacturing the display apparatus.

2. Description of the Related Art

Recently, a display apparatus having light weight and small size has been manufactured. A cathode ray tube ("CRT") display apparatus has been used due to its performance and competitive price. However, the CRT display apparatus has a weakness of a size or portability. Therefore, a display apparatus such as a plasma display apparatus, a liquid crystal display apparatus and an organic light emitting display apparatus is highly regarded due to its small size, light weight and low-power-consumption.

The display apparatus includes a plurality of pixel structures for displaying an image, and each pixel structure includes a thin film transistor ("TFT"). Here, when the characteristics of the TFT change in accordance with changes of process conditions or the like, desired display quality may not be obtained.

SUMMARY

A display apparatus includes a plurality of pixel structures for displaying an image, and each pixel structure includes a thin film transistor ("TFT"). Here, when the characteristics of the TFT change in accordance with changes of process conditions or the like, desired display quality may not be obtained.

One or more exemplary embodiment of the invention provides a display apparatus capable of improving display quality.

One or more exemplary embodiments of the invention also provide a method of manufacturing the display apparatus.

According to an exemplary embodiment of the invention, a display apparatus includes a base substrate, an active pattern disposed on the base substrate, a gate insulation layer disposed on the active pattern, a gate electrode disposed on the gate insulation layer and overlapping the active pattern, a first insulation layer disposed on the gate electrode and having a total amount of hydrogen of about 5 atomic percent (at. %) to about 30 at. %, and a source electrode and a drain electrode which are disposed on the first insulation layer and are electrically connected to the active pattern.

In an exemplary embodiment, the gate electrode may include a conductive layer including aluminum (Al) or aluminum alloy, a first capping layer disposed on the conductive layer and including titanium nitride (TiNx), and a second capping layer disposed on the first capping layer and including titanium (Ti).

In an exemplary embodiment, an atomic ratio of nitrogen and titanium, which is a number of nitrogen atoms divided by a number of titanium atoms, contained in the first capping layer of the gate electrode may be about 0.9 to about 1.2.

In an exemplary embodiment, the active pattern may include poly silicon.

In an exemplary embodiment, the first insulation layer may include silicon (Si), nitrogen (N), and hydrogen (H).

In an exemplary embodiment, Si—H bond in the first insulation layer may be about 0.1 at. % to about 10 at. %, In an exemplary embodiment, the display apparatus may further include a second insulation layer disposed on the first insulation layer, and a storage electrode disposed between the first insulation layer and the second insulation layer and overlapping the gate electrode. The source electrode and the drain electrode may be disposed on the second insulation layer. The storage electrode may include a conductive layer including aluminum (Al) or aluminum alloy, a first capping layer disposed on the conductive layer and including titanium nitride (TiNx), and a second capping layer disposed on the first capping layer and including titanium (Ti).

In an exemplary embodiment, an atomic ratio of nitrogen and titanium, which is a number of nitrogen atoms divided by a number of titanium atoms, contained in the first capping layer of the gate electrode may be about 0.9 to about 1.2.

In an exemplary embodiment, the display apparatus may further include a via insulation layer disposed on the source and drain electrodes, and a light emitting structure disposed on the via insulation layer.

In an exemplary embodiment, the light emitting structure may include a first electrode disposed on the via insulation layer, and electrically connected to the drain electrode, a light emitting layer disposed on the first electrode, and a second electrode disposed on the light emitting layer. A TFT including the active pattern, the gate electrode, the source electrode, and the drain electrode may be a driving transistor for supplying a driving current to the light emitting structure.

In an exemplary embodiment, the first insulation layer may include silicon (Si), nitrogen (N), and hydrogen (H). Si—H bond in the first insulation layer may be about 0.1 at. % to about 10 at. %.

In an exemplary embodiment, the first insulation layer may include silicon (Si), nitrogen (N), and hydrogen (H). The first insulation layer may have a reflective index of about 1.884 to about 2.312.

According to an exemplary embodiment of the invention, a method of manufacturing a display apparatus includes forming an active pattern on a base substrate, forming one of an aluminum film and an aluminum alloy film on the active pattern, forming a titanium nitride film on the one of the aluminum film and the aluminum alloy film, forming a titanium film on the titanium nitride film, forming a gate electrode overlapping the active pattern by etching the one of the aluminum film and the aluminum alloy film, the titanium nitride film, and the titanium film, and forming a first insulation layer having a total amount of hydrogen of about 5 at. % to about 30 at. % on the gate electrode.

In an exemplary embodiment, forming the first insulation layer may be performed by a chemical vapor deposition process or a plasma enhanced chemical vapor deposition process. N2/SiH4 ratio of deposition gas in the deposition process may be about 180 or more.

In an exemplary embodiment, the first insulation layer may include silicon (Si), nitrogen (N), and hydrogen (H). Si—H bond in the first insulation layer may be about 0.1 at. % to about 10 at. %.

In an exemplary embodiment, the first insulation layer may include silicon (Si), nitrogen (N), and hydrogen (H). The first insulation layer may have a reflective index of about 1.884 to about 2.312.

In an exemplary embodiment, the active pattern may include poly silicon.

In an exemplary embodiment, the display apparatus may further include forming a gate insulation layer on the active pattern before forming the gate electrode, forming a storage electrode, which overlaps the gate electrode, on the first insulation layer, and forming a second insulation layer on the storage electrode.

In an exemplary embodiment, the display apparatus may further include defining a contact hole which exposes the active pattern through the second insulation layer, the first insulation layer and the gate insulation layer, forming a drain electrode electrically connected to the active pattern through the contact hole, forming a via insulation layer on the drain electrode, forming a first electrode electrically connected to the drain electrode on the via insulation layer, forming a light emitting layer on the first electrode, and forming a second electrode on the light emitting layer.

According to an exemplary embodiment of the invention, a display apparatus includes a base substrate, an active pattern disposed on the base substrate, a gate insulation layer disposed on the active pattern, a gate electrode disposed on the gate insulation layer and overlapping the active pattern. The gate electrode includes a conductive layer including aluminum (Al) or aluminum alloy, a first capping layer disposed on the conductive layer and including titanium nitride (TiNx), and a second capping layer disposed on the first capping layer and including titanium (Ti), a first insulation layer disposed on the gate electrode, and a source electrode and a drain electrode which are disposed on the first insulation layer and are electrically connected to the active pattern.

According to the exemplary embodiments of the invention, the display apparatus includes an active pattern, a gate electrode including low resistance wiring, and a first insulation layer having a total hydrogen content of about 5 at. % to about 30 at. %. Accordingly, the TFT including the active pattern and the gate electrode may have a driving range suitable for a driving transistor. Accordingly, the display quality may be improved.

It is to be understood that both the foregoing general description and the following detailed description are exemplary and explanatory and are intended to provide further explanation of the invention as claimed.

BRIEF DESCRIPTION OF THE DRAWINGS

The above and other features of the invention will become more apparent by describing in detail exemplary embodiments thereof with reference to the accompanying drawings, in which.

DETAILED DESCRIPTION

Figure 1A:
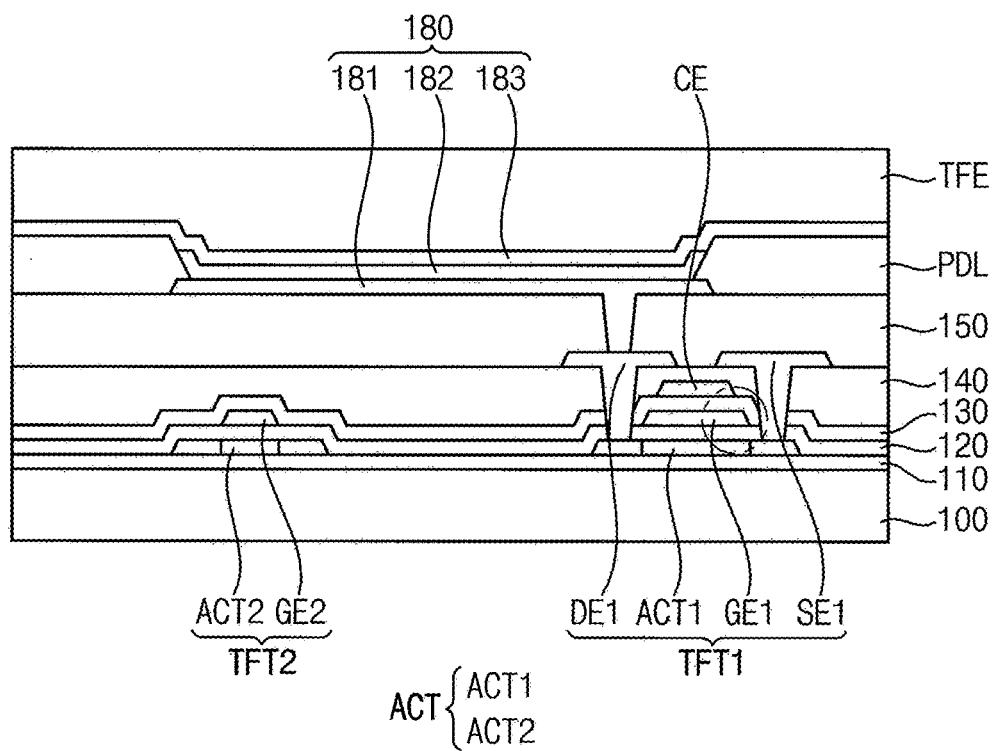
FIG. 1A is a cross-sectional view illustrating an exemplary embodiment of a display apparatus according to the invention.

Hereinafter, the invention will be explained in detail with reference to the accompanying drawings.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 1B:
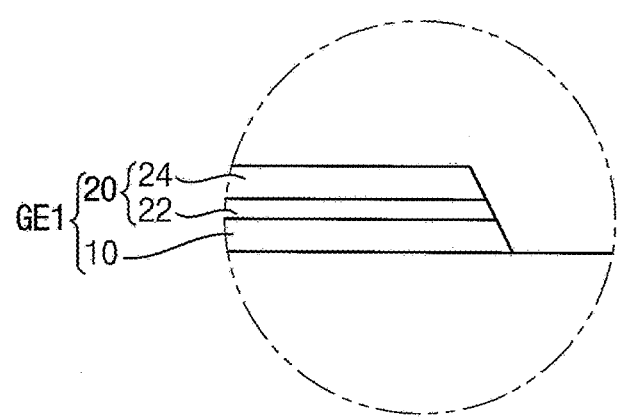
FIG. 1B is an enlarged view of a portion of the display apparatus of FIG. 1A.

FIG. 1A is a cross-sectional view illustrating an exemplary embodiment of a display apparatus according to the invention, and FIG. 1B is an enlarged view of a portion of the display apparatus of FIG. 1A.

Referring to FIG. 1, the display apparatus may include includes a base substrate 100, a buffer layer 110, an active pattern layer, a gate insulation layer 120, a first gate pattern, a first insulation layer 130, a second insulation layer 140, a source/drain pattern, a via insulation layer 150, a light emitting structure 180, a pixel defining layer PDL, and a thin film encapsulation layer TFE.

The base substrate 100 including transparent or opaque insulation materials may be provided. In an exemplary embodiment, the base substrate 100 may include a quartz substrate, a synthetic quartz substrate, a calcium fluoride substrate, a fluoride-doped quartz substrate, a sodalime glass substrate, a non-alkali glass substrate etc., for example. In an alternative exemplary embodiment, the base substrate 100 may include a flexible transparent material such as a flexible transparent resin substrate (e.g., a polyimide substrate). In this case, the polyimide substrate may include a first polyimide layer, a barrier film layer, a second polyimide layer, etc. In an exemplary embodiment, the polyimide substrate may have a configuration where the first polyimide layer, the barrier film layer, and the second polyimide layer, are stack on a rigid glass substrate, for example.

The buffer layer 110 may be disposed on the base substrate 100. In an exemplary embodiment, the buffer layer 110 may be disposed on the entire base substrate 100. The buffer layer 110 may prevent the diffusion of metal atoms and/or impurities from the base substrate 100 into the active pattern layer. In addition, the buffer layer 110 may control a rate of a heat transfer in a crystallization process for forming the active pattern layer, thereby obtaining substantially uniform the active pattern layer. In addition, the buffer layer 110 may improve flatness of a surface of the base substrate 100 when the surface of the base substrate 100 is not uniform.

The active pattern layer may be disposed on the buffer layer 110. The active pattern layer may include a first active pattern ACT1 and a second active pattern ACT2. The first active pattern ACT1 and the second active pattern ACT2 may include polysilicon (poly crystal silicon). Each of the first active pattern ACT1 and the second active pattern ACT2 may include drain and source regions doped with an impurity and a channel region between the drain region and the source region.

The gate insulation layer 120 may cover the active pattern layer on the buffer layer 110 and may be disposed at substantially the same thickness along the profile of the active pattern layer. In an exemplary embodiment, the gate insulation layer 120 may include an inorganic insulation material such as a silicon compound, a metal oxide, or the like.

The first gate pattern may be disposed on the gate insulation layer 120. The first gate pattern may include a first gate electrode GE1 a second gate electrode GE2, and signal wiring such as a gate line.

The first gate pattern may have a multi-layer structure including a conductive layer 10 and a capping layer 20. The conductive layer 10 may be disposed on the gate insulation layer 120, and the capping layer 20 may be disposed on the conductive layer 10.

The conductive layer 10 may include aluminum (Al) or an aluminum alloy as an electrically conductive layer. In an exemplary embodiment, the aluminum alloy may include at least one of nickel (Ni), lanthanum, neodymium (Nd), and germanium (Ge) as an additive material together with aluminum as a base material. In an exemplary embodiment, the additive material such as nickel may be contained in an amount of about 2 atomic percent (at. %) or less based on the entire aluminum alloy, for example, but is not limited thereto.

Since the aluminum has a sheet resistance of 0.15 ohm per square ($\Omega/\square$) (based on a thickness of 3 kiloangstroms (kÅ)) which has a relatively low resistance characteristic than molybdenum (Mo) having a sheet resistance of $0.55\Omega/\square$ (based on a thickness of 2.5 kÅ), the conductive layer 10 including aluminum or aluminum alloy may have a sufficient level of electrical conductivity even when it is provided to have a small thickness.

The capping layer 20 may be disposed on the conductive layer 10. The capping layer 20 may have a multilayer structure and include a first capping layer 22 disposed on the conductive layer 10 and a second capping layer 24 disposed on the first capping layer 22.

The first capping layer 22 may be disposed directly on the conductive layer 10 to contact the conductive layer 10 and may be disposed to substantially cover a top surface of the conductive layer 10. In an exemplary embodiment, the first capping layer 22 may include titanium nitride (TiNx), for example.

As described above, the conductive layer 10 may include an aluminum-including material. In this case, hillock may be generated in aluminum during a process of activating a semiconductor layer of a thin film transistor at a high temperature (about 400 degrees Celsius (° C.) to about 580° C.) or a process for defining a contact hole in which a plasma is generated. This may cause increasing of resistance of the conductive layer 10.

When an upper surface of the conductive layer 10 is capped with titanium (Ti), hillocks may be prevented. However, in this case, diffusion occurs at an interface between aluminum and titanium at the high-temperature process, so that aluminum-titanium alloy is provided and the resistance of the conductive layer 10 may be increase. Damage to aluminum and titanium may occur due to hydrofluoric acid (HF) used as a cleaning liquid during a cleaning process such as buffer oxide etch ("BOE").

Thus, by capping the conductive layer 10 with titanium nitride such as the first capping layer 22, it is possible to prevent hillock of the conductive layer 10 and prevent damage to the conductive layer 10 and the capping layer 20. Further, since diffusion between aluminum and titanium may be prevented, an aluminum-titanium alloy such as Al3Ti may not be provided at the interface between the conductive layer 10 and the first capping layer 22, or may be provided only in a trace amount.

In an exemplary embodiment, a thickness of the first capping layer 22 may range from about 50 Å to about 400 Å, for example. When the thickness of the first capping layer 22 is about 50 Å or more, damage due to the subsequent BOE process may be suppressed and increase in resistance due to aluminum-titanium diffusion may be prevented. When the thickness of the first capping layer 22 is less than about 400 Å, efficiency of the thin film process may not be deteriorated.

The atomic ratio (the number of nitrogen atoms/the number of titanium atoms) of nitrogen (N) and titanium (Ti) contained in the first capping layer 22 may be about 0.9 to about 1.2. When the nitrogen atom ratio to titanium is 0.9 or more, formation of the aluminum-titanium alloy may be effectively prevented. When the nitrogen atom ratio to titanium is about 1.2 or less, generation of particles of the first capping layer 22 may be suppressed.

The nitrogen atom ratio contained in the first capping layer 22 may be substantially uniform regardless of a position in the first capping layer 22, but is not limited thereto. The nitrogen atoms may have different degrees of distribution depending on the position in the thickness direction of the first capping layer 22.

The second capping layer 24 may be disposed directly on the first capping layer 22 to be in contact with the first capping layer 22, and may be disposed to substantially cover the top surface of the first capping layer 22. In an exemplary embodiment, the second capping layer 24 may include titanium, for example.

As described above, the first capping layer 22 may include titanium nitride to prevent damage to or diffusion phenomenon between aluminum and titanium. However, higher nitrogen ratio in the process of forming the titanium nitride may cause formation of the more particles which may lead to a process failure. Therefore, amount of particle generation may be stabilized by forming the second capping layer 24 including titanium on the first capping layer 22.

The first insulation layer 130 may be disposed on the gate insulation layer 120 on which the first gate pattern is disposed. In an exemplary embodiment, the first insulation layer 130 may include silicon nitride, for example.

In an exemplary embodiment, the first insulation layer 130 may include silicon (Si), hydrogen (H), and nitrogen (N), for example. Specifically, total amount of hydrogen in the first insulation layer 130 may be about 5 at. % to about 30 at. %, for example. In addition, Si—H bond in the first insulation layer 130 may be about 0.1 at. % to about 10 at. %, for example. In addition, refractive index ("RI") of the first insulation layer 130 may be about 1.884 to about 2.312.

The second gate pattern may be disposed on the first insulation layer 130. The second gate pattern may include a storage electrode CE and a signal line. The storage electrode CE may overlap with the first gate electrode GE1 to form a storage capacitor. The second gate pattern may also be composed of a low resistance wiring. In an exemplary embodiment, the second gate pattern may include a conductive layer including aluminum (Al) or an aluminum alloy, a first capping layer disposed on the conductive layer and including titanium nitride (TiNx), and a second capping layer disposed on the first capping layer and including titanium (Ti) like the first gate pattern, for example.

The second insulation layer 140 may be disposed on the second gate pattern. The second insulation layer 140 may sufficiently cover the second gate pattern on the first insulation layer 130, so that the second insulation layer 140 may have a substantially flat top surface without creating a step around the second gate pattern. The second insulation layer 140 may include an inorganic insulating material such as a silicon compound or a metal oxide The source/drain pattern may be disposed on the second insulation layer 140. The source/drain pattern may include a first source electrode SE1 and a first drain electrode DE1. The first source electrode SE1 may be electrically connected to the active pattern ACT through a contact hole defined through the second insulation layer 140, the first insulation layer 130, and the gate insulation layer 120. The first drain electrode DE1 may be electrically connected to the active pattern ACT through a contact hole defined through the second insulation layer 140, the first insulation layer 130, and the gate insulation layer 120.

The source/drain pattern may also be composed of low resistance wiring. In an exemplary embodiment, the source/drain pattern may include a conductive layer including aluminum (Al) or an aluminum alloy, a first capping layer disposed on the conductive layer and including titanium nitride (TiNx), and a second capping layer disposed on the first capping layer and including titanium, for example.

A first thin film transistor TFT1 may include the first gate electrode GE1, the first active pattern ACT1, the first source electrode SE1, and the first drain electrode DE1. The first thin film transistor TFT1 may be a driving transistor electrically connected to the light emitting structure 180 to provide a driving current corresponding to a data signal.

A second thin film transistor TFT2 may include the second gate electrode GE2 and the second active pattern ACT2, and may be a switching transistor included in the pixel circuit.

The via insulation layer 150 may be disposed on the second insulation layer 140 on which the source/drain patterns are disposed. The via insulation layer 150 may have a single-layer structure, but may have a multi-layer structure including at least two insulation layers. The via insulation layer 150 may be provided using an organic material such photoresist, an acrylic resin, a polyimide resin, a polyamide resin, or a siloxane-based resin.

The light emitting structure 180 may include a first electrode 181, an emission layer 182 and a second electrode 183.

The first electrode 181 may be disposed on the via insulation layer 150. The first electrode 181 may include a reflective material or a transmissive material in accordance with the emission type of the display apparatus. In exemplary embodiments, the first electrode 181 may have a single layer structure or a multi-layer structure, which may include a metal film, an alloy film, a metal nitride film, a conductive metal oxide film and/or a transparent conductive film.

The pixel defining layer PDL may be disposed on the via insulation layer 150 on which the first electrode 181 is disposed. The pixel defining layer PDL may be provided using an organic material. In an exemplary embodiment, the pixel defining layer PDL may include photoresist, acryl-based resin, polyimide-based resin, polyamide-based resin, siloxane-based resin, etc., for example. In some exemplary embodiments, an opening which exposes the first electrode 181 may be provided by etching the pixel defining layer PDL. An emitting area and a non-emitting area of the display apparatus may be defined by the opening of the pixel defining layer PDL. In an exemplary embodiment, a portion where the opening of the pixel defining layer PDL is located may correspond to an emitting area, and a non-emitting area may correspond to a portion adjacent to the opening of the pixel defining layer PDL, for example.

The light emitting layer 182 may be disposed on the first electrode 181 exposed through the opening of the pixel defining layer PDL. In addition, the light emitting layer 182 may extend on a sidewall of the opening of the pixel defining layer PDL. In some exemplary embodiments, the light emitting layer 182 may include an organic light emitting layer ("EL"), a hole injection layer ("HIL"), a hole transfer layer ("HTL"), an electron transfer layer ("ETL"), an electron injection layer ("EIL"), etc. In some exemplary embodiments, except for the organic emission layer, the HIL, the hole transport layer, the electron transport layer, and the EIL may be provided in common to correspond to a plurality of pixels. In some exemplary embodiments, a plurality of ELs may be provided using light emitting materials for generating different colors of light such as a red color of light, a green color of light and a blue color of light in accordance with color pixels of the display device. In some exemplary embodiments, the EL of the light emitting layer 182 may include a plurality of stacked light emitting materials for generating a red color of light, a green color of light and a blue color of light to thereby emitting a white color of light. Here, elements of the light emitting layer 182 are commonly provided so as to correspond to a plurality of pixels, and each pixel may be divided by a color filter layer.

The second electrode 183 may be disposed on the pixel defining layer PDL and the light emitting layer 182. The second electrode 183 may include a transmissive material or a reflective material in accordance with the emission type of the display device. In exemplary embodiments, the second electrode 183 may also have a single layer structure or a multi-layer structure, which may include a metal film, an alloy film, a metal nitride film, a conductive metal oxide film and/or a transparent conductive film.

The thin film encapsulation layer TFE may be disposed on the second electrode 183. The thin film encapsulation layer TFE may prevent penetration of moisture and oxygen from outside. The thin film encapsulation layer TFE may include at least one organic layer and at least one inorganic layer. The at least one organic layer and the at least one inorganic layer may be alternately stacked with each other. In an exemplary embodiment, the thin film encapsulation layer TFE may include two inorganic layers and one organic layer therebetween, for example, but is not limited thereto. In some exemplary embodiments, it is possible to provide a sealing substrate for shielding outside air and moisture from penetrating into the display apparatus instead of the thin film encapsulation layer TFE.

Figure 2:
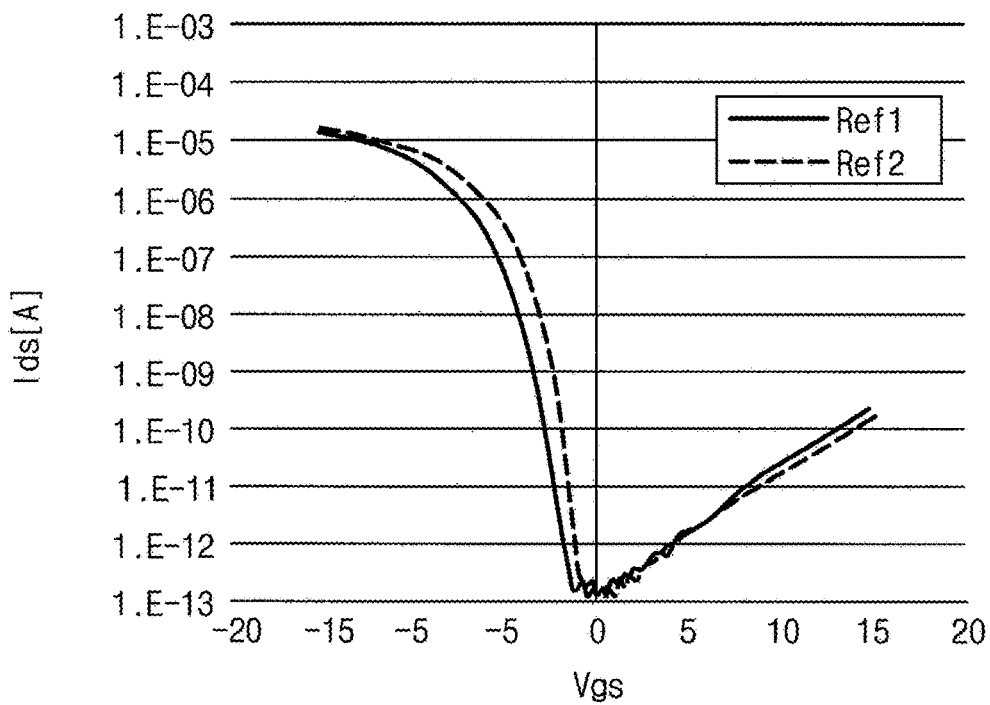
FIG. 2 is a graph showing changes in I-V curve of a thin film transistor ("TFT") according to a constituent material of a gate metal layer.

FIG. 2 is a graph showing changes in I-V curve of a thin film transistor according to a constituent material of a gate metal layer.

Referring to FIG. 2, the graph shows changes in Ids (drain current) according to Vgs (gate-source voltage) depending on a metal layer of the gate electrode, i.e., an change of the I-V curve is shown in the graph. That is, the X-axis of the graph represents Vgs and the Y-axis represents Ids.

When the gate electrode of the thin film transistor includes molybdenum (Mo) (Ref1), the slope of the I-V curve is gentle (left portion of the graph), so that Ids gradually changes according to Vgs. Thus, a sufficient driving range ("DR") may be ensured. Therefore, the thin film transistor is suitable as a driving transistor of an organic light emitting diode ("OLED") display apparatus.

When the gate electrode of the thin film transistor is composed of a low resistance wiring, for example, when the gate electrode includes a conductive layer including aluminum (Al) or an aluminum alloy, a first capping layer disposed on the conductive layer and including titanium nitride (TiNx), and a second capping layer disposed on the first capping layer and including titanium (Ref2), the I-V curve of the thin film transistor is shifted to right and the slope is urgent (left portion of the graph). As a result, driving range becomes insufficient and the thin film transistor becomes unsuitable as the driving transistor of the OLED display apparatus.

Figure 3:
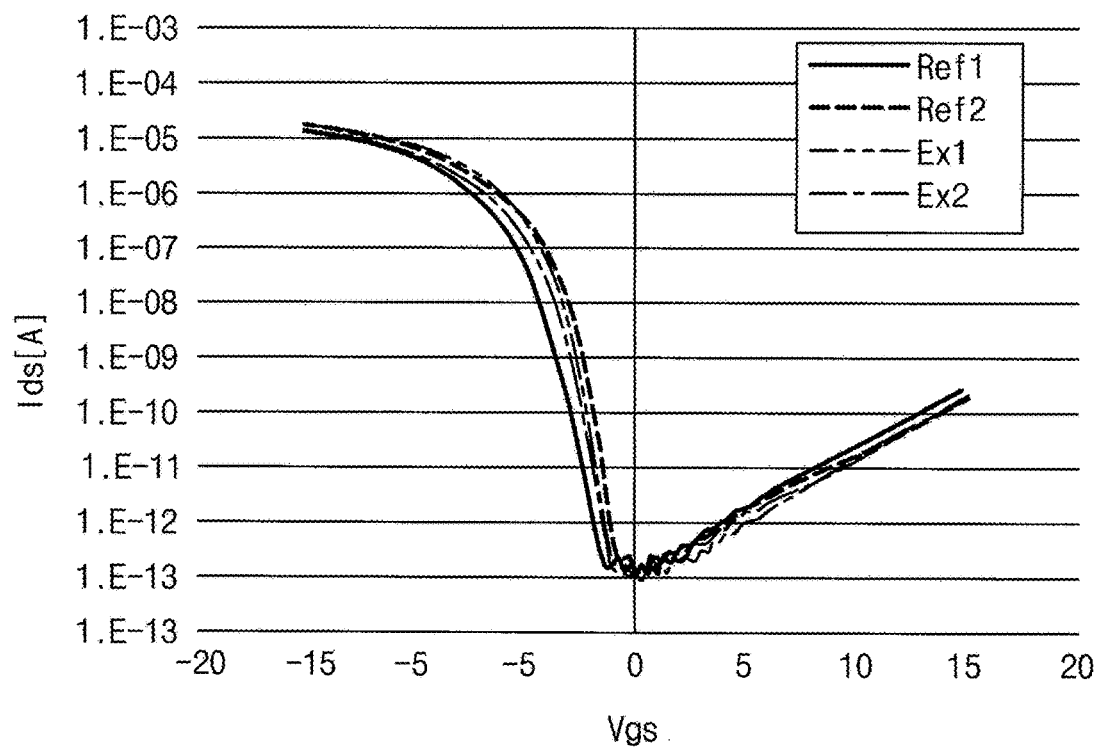
FIG. 3 is a graph showing I-V curves of the TFTs of experimental example 1 and experimental example 2 according to a constituent material of a first insulation layer.

FIG. 3 is a graph showing I-V curves of the thin film transistors of experimental example 1 and experimental example 2 according to a constituent material of a first insulation layer.

Referring to FIGS. 1 to 3, as a result of examining in various experiments the reason why the I-V curve of the driving transistor is shifted and the slope is undesirably sharpened and the DR is getting small, it was confirmed that the I-V curve was changed according to the constituent materials of the first insulation layer 130 covering the gate electrode GE1 of the driving transistor. Here, the driving transistor is a polysilicon transistor.

Also, it was confirmed that the slope of the I-V curve was sharply shifted after the hydrogen treatment of the active pattern of the thin film transistor. In contrast to this, it was expected that reducing the influence by hydrogen would reduce the shift amount and slope change of the I-V curve, and several experiments were conducted to support this.

As shown in Table 1 below, in a first reference example (Ref1), the gate electrode includes molybdenum (Mo), total amount of hydrogen in the first insulation layer (SiNx) is about 23.0 at. %, Si—H Bond is about 1.6 at. %, and N—H Bond is about 22.0 at. %. At this time, the driving range DR of the thin film transistor is about −3.12 V and the threshold voltage Vth is about −3.47 V.

In a first experimental example (Ex1), the gate electrode was composed of the low resistance wiring (aluminum/titanium nitride/titanium structure), total amount of hydrogen in the first insulation layer (Low H SiNx-1) is about 14.6 at. %, Si—H Bond is about 13.4 at. %, and N—H Bond is about 1.5 at. %. At this time, the driving range DR of the thin film transistor is −2.77 V, and the threshold voltage Vth is about −2.87 V.

In a second experimental example (Ex2), the gate electrode was composed of the low resistance wiring total amount of hydrogen in the first insulation layer (Low H SiNx-2) is about 14.1 at. %, Si—H Bond is about 0.7 at. %, and N—H Bond is about 13.5 at. %. At this time, the driving range DR of the thin film transistor is about −3.08 V, and the threshold voltage Vth is about −3.15 V.

TABLE 1

| No. | Gate electrode | First insulation layer | N—H | Si—H | Total | DR(V) | Vth(V) |
|---|---|---|---|---|---|---|---|
| Ref1 | Mo (Ref.) | SiNx(Ref.) | 22.0 | 1.6 | 23.0 | −3.12 | −3.47 |
| Ref2 | Ti/TiN/S—Al | SiNx(Ref.) | 22.0 | 1.6 | 23.0 | −2.90 | −2.73 |
| Ex1 | Ti/TiN/S—Al | Low H SiNx-1 | 1.5 | 13.4 | 14.6 | −2.77 | −2.87 |
| Ex2 | Ti/TiN/S—Al | Low H SiNx-2 | 13.5 | 0.7 | 14.1 | −3.08 | −3.15 |

As a result of the experiment, it was found that as the amount of N—H bonding increases in the first insulation layer and the amount of Si—H bonding decreases, the amount of hydrogen movement decreases. Therefore, the influence of hydrogen is reduced, and the change in the characteristics of the thin film transistor s not larger than the Ref 1.

In addition, characteristics were confirmed for the experimental examples shown in Table 2 below.

TABLE 2

| No. | Driving Range(V) | total amount of hydrogen (at. %) | Si—H (at. %) | N—H (at. %) | RI (at. %) |
|---|---|---|---|---|---|
| 1 | 2.9 | 23.05 | 1.66 | 22.06 | 1.884 |
| 2 | 2.76 | 14.60 | 13.47 | 1.51 | 2.312 |
| 3 | 2.76 | 12.04 | 9.38 | 3.23 | 2.162 |
| 4 | 2.89 | 10.66 | 7.55 | 3.63 | 2.109 |
| 5 | 3.09 | 14.10 | 0.75 | 13.55 | 1.951 |

Through the cases No. 2 and No. 5 of Table 2, when the hydrogen resulting from the Si—H bond is reduced, it may be confirmed that the influence on DR (driving range) is about 0.023 V per 1 at. %. Therefore, Si—H Bond is preferablry about 0.1 at. % or more.

Through the cases No. 2 and No. 3 of Table 2, when the Si—H bond exceeds about 9.38 at. %, it may be confirmed that there is almost no influence on the DR. Therefore, Si—H Bond is preferably about 10 at. % or less.

Further, since the total amount of hydrogen in a general silicon nitride (SiNx) thin film is usually about 25 at. % to about 30 at. %, the total amount of hydrogen is preferably about 30 at. % or less, Since total amount of hydrogen in a low hydrogen silicon nitride thin film is usually about 5 to about 15 at. %, the total amount of hydrogen is preferably about 5 at. % or more.

Here, reflective index (RI) of the first insulation layer may range from about 1.884 to about 2.312.

Taken together, therefore, when the total amount of hydrogen in the first insulation layer 130 is about 5 at. % to about 30 at. %. Si—H Bond in the first insulation layer 130 is about 0.1 at. % to about 10 at. %, and the reflective index (RI) of the first insulation layer 130 is about 1.884 to about 2.312, desired thin film transistor characteristics may be obtained.

FIGS. 4A to 4D are cross-sectional views illustrating a method of manufacturing the display apparatus of FIG. 1.

Figure 4A:
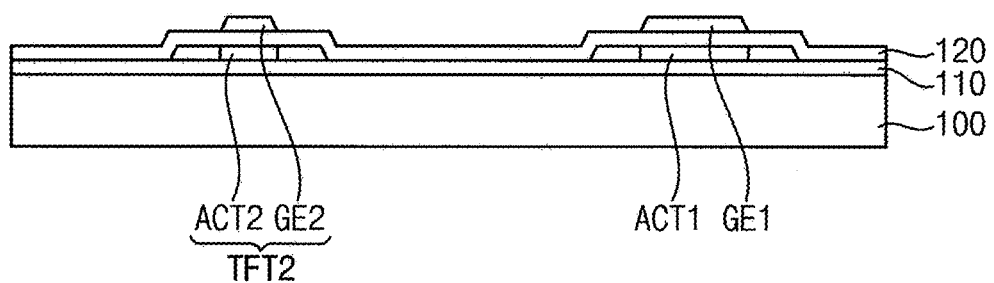
FIGS. 4A to 4D are cross-sectional views illustrating a method of manufacturing the display apparatus of FIG. 1A.

Referring to FIG. 4A, a buffer layer 110 may be disposed on a base substrate 100. An active pattern layer including a first active pattern ACT1 and a second active pattern ACT2 may be disposed on the buffer layer 110. The active pattern layer may be provided by forming an amorphous silicon layer, crystallizing the amorphous silicon layer, and patterning it by a photolithography method or the like.

A gate insulation layer 120 may be disposed on the active pattern layer. A first gate pattern including a first gate electrode GE1 and a second gate electrode GE2 may be disposed on the gate insulation layer 120.

Here, the first gate pattern may include a conductive layer, a first capping layer, and a second capping layer (refer to FIG. 1).

In an exemplary embodiment, an aluminum film or an aluminum alloy film may be disposed on the first gate insulation layer 120, for example. A titanium nitride film may be disposed on the aluminum film or the aluminum alloy film.

In an exemplary embodiment, the titanium nitride film may be provided by supplying titanium, nitrogen, and an inert gas into a sputtering chamber on which the aluminum film or the aluminum alloy film is placed and applying a voltage thereto, for example. At this time, by supplying a larger amount of nitrogen than the inert gas, the titanium nitride film may be disposed under nitrogen-rich (N-rich). Accordingly, the atomic ratio (number of nitrogen atoms/number of titanium atoms) of nitrogen to titanium in the titanium nitride film may be adjusted to level of about 0.9 to about 1.2. In an exemplary embodiment, the inert gas may be argon (Ar), helium (He), or the like.

A titanium film may be disposed on the titanium nitride film. In an exemplary embodiment, the titanium film may be provided by sputtering, specifically, by continuous sputtering, for example. More specifically, the titanium film on the titanium nitride film may be continuously provided in the same sputtering chamber by blocking supplement of nitrogen during a sputtering process in which titanium and nitrogen is supplied for a formation of the titanium nitride film (i.e., continuous sputtering).

Thereafter, the first gate pattern having a predetermined pattern may be provided by etching the aluminum film (or the aluminum alloy film), the titanium nitride film, and the titanium film.

Figure 4B:
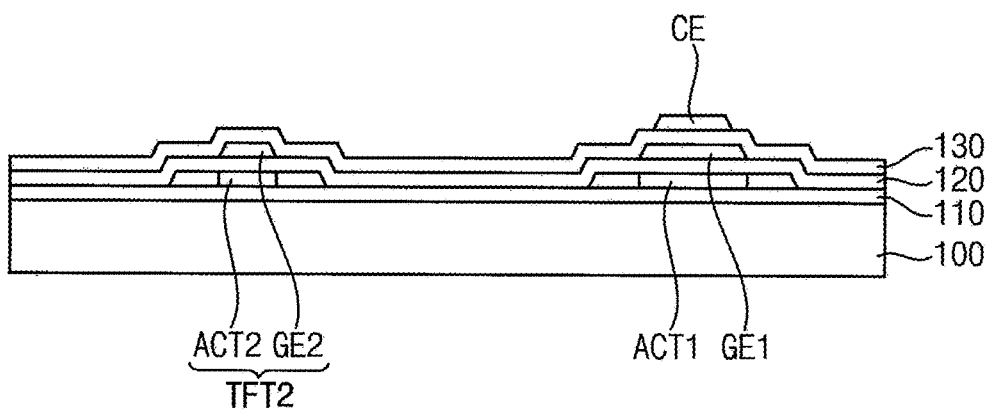

Referring to FIG. 4B, a first insulation layer 130 may be disposed on the gate insulation layer 120 in which the first gate pattern is provided. In an exemplary embodiment, the first insulation layer 130 may include silicon (Si), hydrogen (H), and nitrogen (N), for example. Specifically, the total amount of hydrogen in the first insulation layer 130 may be about 5 at. % to about 30 at. %. In addition, Si—H bond in the first insulation layer 130 may be about 0.1 at. % to about 10 at. %. In addition, Si—H Bond in the first insulation layer 130 may be about 0.1 at. % to about 10 at. %.

The first insulation layer 130 may be provided by a chemical vapor deposition process, a plasma enhanced chemical vapor deposition process, or the like. At this time, in order to limit the total amount of hydrogen to about 30 at. % or less, N2/SiH4. The ratio may be provided at 180 or more.

Figure 4C:
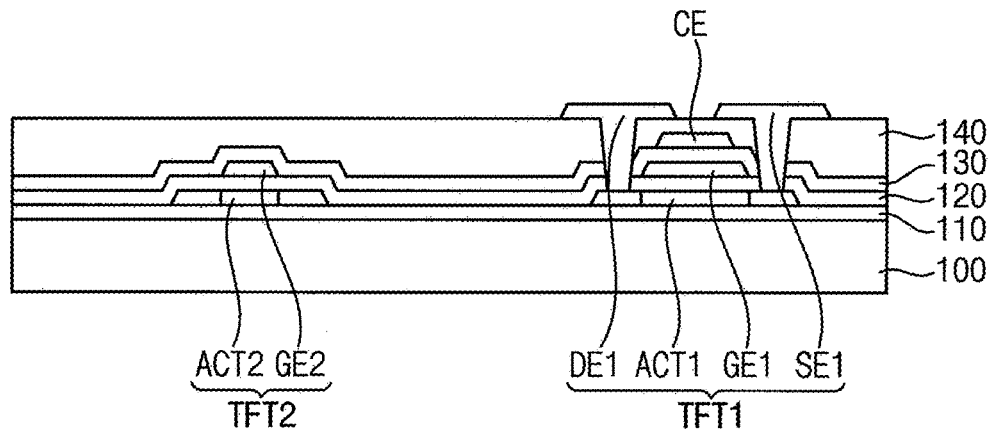

Referring to FIG. 4C, a first gate pattern including the storage electrode CE may be disposed on the first insulation layer 130. The second insulation layer 140 may be disposed on the first insulation layer 130 on which the first gate pattern is disposed. The second insulation layer 140, the first insulation layer 130, and the gate insulation layer 120 may be partially removed to define an opening exposing the first active pattern ACT1. Thereafter, a source/drain pattern including a first source electrode SE1 and a first drain electrode DE1 may be disposed on the second insulation layer 130.

Accordingly, a first thin film transistor TFT1 including the first active pattern ACT1, the first gate electrode GE1, the first drain electrode DE1, and the first source electrode SE1 may be provided. In addition, the second thin film transistor TFT2 which is a switching transistor including the second active pattern ACT2 and the second gate electrode GE2 may be provided.

Figure 4D:
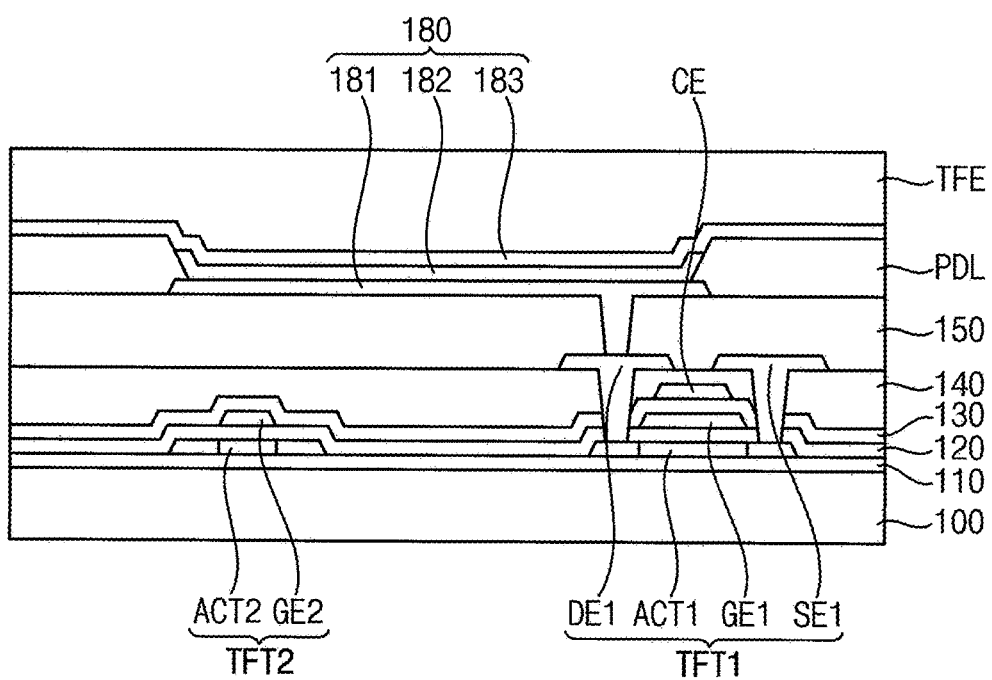

Referring to FIG. 4D, a via insulation layer 150 may be disposed on the second insulation layer 140 on which the source/drain pattern is disposed. The first electrode 181 may be disposed on the via insulation layer 150. A pixel defining layer PDL may be disposed on the via insulation layer 150 on which the first electrode 181 is disposed. A light emitting layer 182 may be disposed on the first electrode 181 in an opening of the pixel defining layer PDL. The second electrode 183 may be disposed on the light emitting layer 182. A thin film encapsulation layer TFE may be disposed on the second electrode 183 to manufacture the display apparatus. The via insulation layer 150, the first electrode 181, the pixel defining layer PDL, the light emitting layer 182, the second electrode 183 and the thin film encapsulation layer TFE may be provided through various known methods, and detailed description thereof will be omitted.

Figure 5:
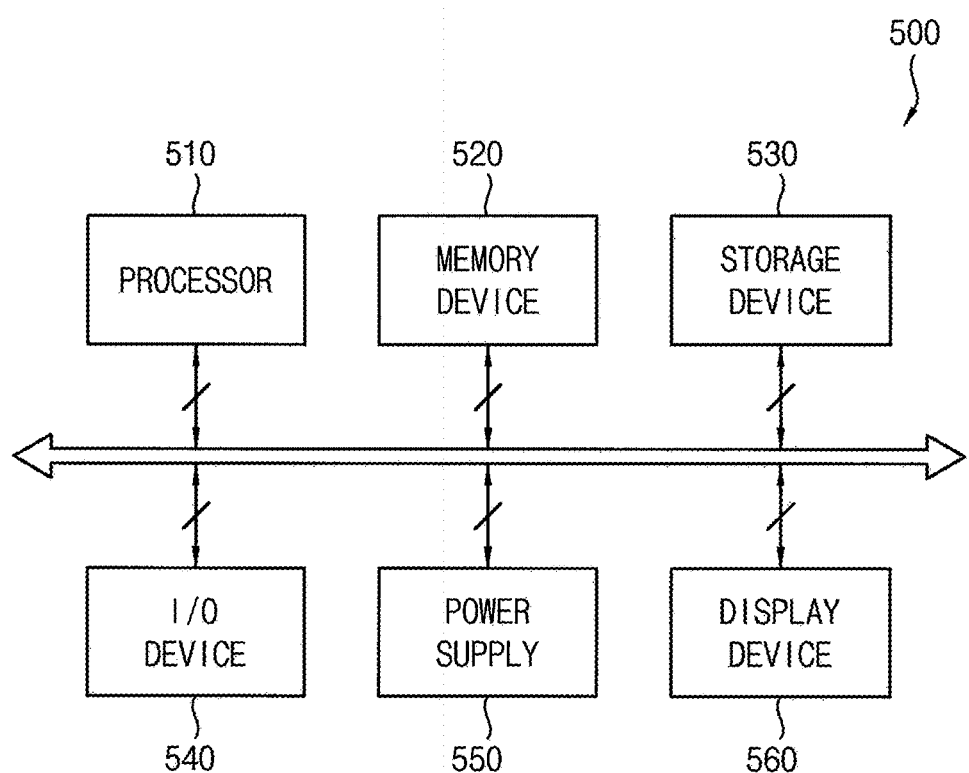
FIG. 5 is a block diagram illustrating an exemplary embodiment of an electronic device.
Figure 6A:
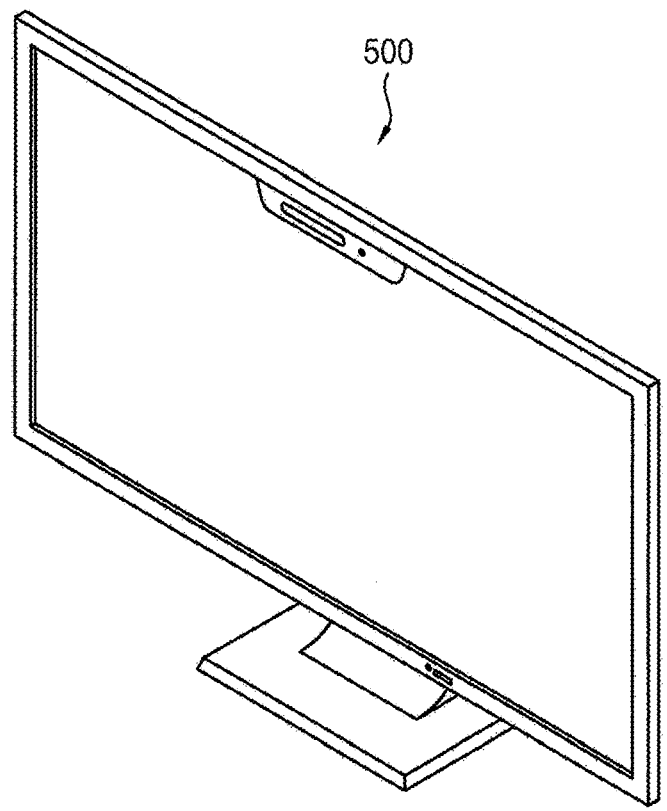
FIG. 6A is a diagram illustrating an example in which the electronic device of FIG. 5 is implemented as a television.
Figure 6B:
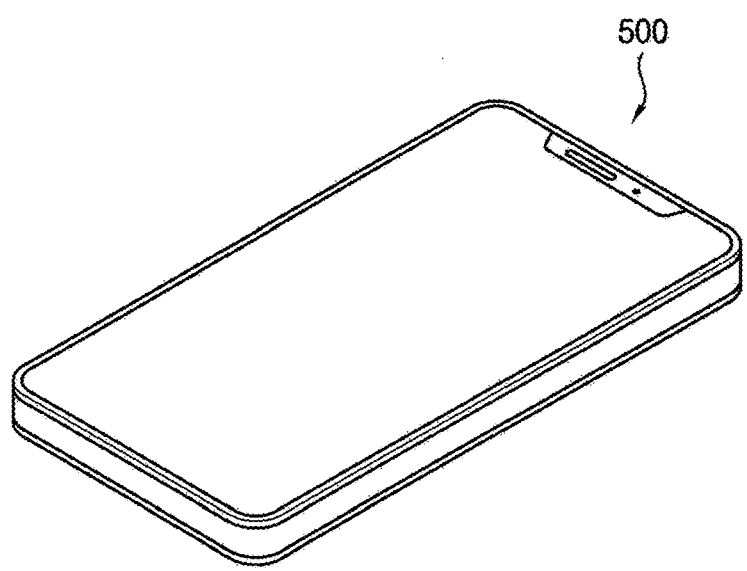
FIG. 6B is a diagram illustrating an example in which the electronic device of FIG. 5 is implemented as a smart phone.

FIG. 5 is a block diagram illustrating an exemplary embodiment of an electronic device. FIG. 6A is a diagram illustrating an example in which the electronic device of FIG. 5 is implemented as a television. FIG. 6B is a diagram illustrating an example in which the electronic device of FIG. 5 is implemented as a smart phone.

Referring to FIGS. 5 through 6B, the electronic device 500 may include a processor 510, a memory device 520, a storage device 530, an input/output ("I/O") device 540, a power supply 550, and a display device 560. Here, the display device 560 may correspond to the display apparatus of FIG. 1. In addition, the electronic device 500 may further include a plurality of ports for communicating with a video card, a sound card, a memory card, a universal serial bus ("USB") device, other electronic devices, etc. In an exemplary embodiment, as illustrated in FIG. 6A, the electronic device 500 may be implemented as a television. In another exemplary embodiment, as illustrated in FIG. 6B, the electronic device 500 may be implemented as a smart phone. However, the electronic device 500 is not limited thereto. In an exemplary embodiment, the electronic device 500 may be implemented as a cellular phone, a video phone, a smart pad, a smart watch, a tablet personal computer ("PC"), a car navigation system, a computer monitor, a laptop, a head mounted display ("HMD"), etc., for example.

The processor 510 may perform various computing functions. The processor 510 may be a microprocessor, a central processing unit ("CPU"), an application processor ("AP"), etc. The processor 510 may be coupled to other components via an address bus, a control bus, a data bus, etc. Further, the processor 510 may be coupled to an extended bus such as a peripheral component interconnection ("PCI") bus. The memory device 520 may store data for operations of the electronic device 500. In an exemplary embodiment, the memory device 520 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, etc., and/or at least one volatile memory device such as a dynamic random access memory ("DRAM") device, a static random access memory ("SRAM") device, a mobile DRAM device, etc., for example. The storage device 530 may include a solid state drive ("SSD") device, a hard disk drive ("HDD") device, a CD-ROM device, etc. The I/O device 540 may include an input device such as a keyboard, a keypad, a mouse device, a touchpad, a touch-screen, etc., and an output device such as a printer, a speaker, etc. The power supply 550 may provide power for operations of the electronic device 500.

The display device 560 may be coupled to other components via the buses or other communication links. In some exemplary embodiments, the display device 560 may be included in the I/O device 540. As described above, the display device 560 may include an active pattern, a gate electrode including a low resistance wiring, and a first insulation layer having a total amount of hydrogen of about 5 at. % to about 30 at. %. Accordingly, the thin film transistor including the active pattern and the gate electrode may have a driving range suitable for the driving transistor. Thus, the display quality may be improved. However, since this has been described above, a duplicate description thereof will be omitted.

The invention may be applied to an organic light emitting display device and various electronic devices including the same. In an exemplary embodiment, the invention may be applied to mobile phones, smart phones, video phones, smart pads, smart watches, tablet PCs, car navigation systems, televisions, computer monitors, notebooks, head mount display, etc., for example.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A display apparatus, comprising:
a base substrate;
an active pattern disposed on the base substrate;
a gate insulation layer disposed on the active pattern;
a gate electrode disposed on the gate insulation layer and overlapping the active pattern;
a first insulation layer disposed on the gate electrode and having a total amount of hydrogen of about 5 atomic percent to about 30 atomic percent;
a source electrode and a drain electrode which are disposed on the first insulation layer and are electrically connected to the active pattern;
a second insulation layer disposed on the first insulation layer; and
a storage electrode disposed between the first insulation layer and the second insulation layer and overlapping the gate electrode.

2. The display apparatus of claim 1, wherein the gate electrode comprises:
a conductive layer comprising aluminum (Al) or aluminum alloy;
a first capping layer disposed on the conductive layer and comprising titanium nitride (TiNx); and
a second capping layer disposed on the first capping layer and comprising titanium (Ti).

3. The display apparatus of claim 2, wherein an atomic ratio of nitrogen and titanium, which is a number of nitrogen atoms divided by a number of titanium atoms, contained in the first capping layer of the gate electrode is about 0.9 to about 1.2.

4. The display apparatus of claim 2, wherein the active pattern comprises poly silicon.

5. The display apparatus of claim 1, wherein the first insulation layer comprises silicon (Si), nitrogen (N), and hydrogen (H).

6. The display apparatus of claim 5, wherein Si—H bond in the first insulation layer is about 0.1 at. % to about 10 at. %.

7. The display apparatus of claim 1,
wherein the source electrode and the drain electrode are disposed on the second insulation layer,
the storage electrode comprises:
a conductive layer comprising aluminum (Al) or aluminum alloy;
a first capping layer disposed on the conductive layer and comprising titanium nitride (TiNx); and
a second capping layer disposed on the first capping layer and comprising titanium (Ti).

8. The display apparatus of claim 7, wherein an atomic ratio of nitrogen and titanium, which is a number of nitrogen atoms divided by a number of titanium atoms, contained in the first capping layer of the gate electrode is about 0.9 to about 1.2.

9. The display apparatus of claim 1, further comprising:
a via insulation layer disposed on the source and drain electrodes; and
a light emitting structure disposed on the via insulation layer.

10. The display apparatus of claim 9, wherein the light emitting structure comprises:
a first electrode disposed on the via insulation layer, and electrically connected to the drain electrode;
a light emitting layer disposed on the first electrode; and
a second electrode disposed on the light emitting layer, and
wherein a thin film transistor comprising the active pattern, the gate electrode, the source electrode, and the drain electrode is a driving transistor for supplying a driving current to the light emitting structure.

11. The display apparatus of claim 10, wherein the first insulation layer comprises silicon (Si), nitrogen (N), and hydrogen (H), and
Si—H bond in the first insulation layer is about 0.1 atomic percent to about 10 atomic percent.

12. The display apparatus of claim 1, wherein the first insulation layer comprises silicon (Si), nitrogen (N), and hydrogen (H), and
the first insulation layer has a reflective index of about 1.884 to about 2.312.

13. A display apparatus, comprising:
a base substrate;
an active pattern disposed on the base substrate;
a gate insulation layer disposed on the active pattern;
a gate electrode disposed on the gate insulation layer and overlapping the active pattern, the gate electrode comprising:
a conductive layer comprising aluminum (Al) or aluminum alloy;
a first capping layer disposed on the conductive layer and comprising titanium nitride (TiNx); and
a second capping layer disposed on the first capping layer and comprising titanium (Ti);
a first insulation layer disposed on the gate electrode; and
a source electrode and a drain electrode which are disposed on the first insulation layer and are electrically connected to the active pattern.

* * * * *